(12) United States Patent
Ide et al.

(10) Patent No.: US 8,320,195 B2
(45) Date of Patent: Nov. 27, 2012

(54) MEMORY CIRCUIT AND METHOD OF WRITING DATA TO AND READING DATA FROM MEMORY CIRCUIT

(75) Inventors: Masao Ide, Kawasaki (JP); Tomohiro Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/656,697

(22) Filed: Feb. 12, 2010

(65) Prior Publication Data

US 2010/0149885 A1 Jun. 17, 2010

Related U.S. Application Data

(63) Continuation of application No. PCT/JP2007/068258, filed on Sep. 20, 2007.

(51) Int. Cl.
*G11C 7/10* (2006.01)
(52) U.S. Cl. .................................. 365/189.05; 327/211
(58) Field of Classification Search .................. 365/154, 365/189.05, 230.08, 189.14; 714/226; 327/202, 327/211
See application file for complete search history.

(56) References Cited

U.S. PATENT DOCUMENTS

| | | | | |
|---|---|---|---|---|
| 5,016,070 A * | 5/1991 | Sundaresan | .................... | 257/302 |
| 5,327,566 A * | 7/1994 | Forsyth | .......................... | 710/260 |
| 5,436,572 A | 7/1995 | Sugiyama | | |
| 5,860,160 A * | 1/1999 | Narayana et al. | ............. | 711/109 |
| 6,696,873 B2 * | 2/2004 | Hazucha et al. | ............. | 327/203 |
| 6,826,090 B1 * | 11/2004 | Chu et al. | ................. | 365/189.05 |
| 6,864,733 B2 * | 3/2005 | Anshumali et al. | ........... | 327/210 |
| 7,278,074 B2 * | 10/2007 | Mitra et al. | .................... | 714/724 |
| 2002/0008589 A1 * | 1/2002 | Lanoman et al. | ................ | 331/34 |
| 2006/0184852 A1 * | 8/2006 | Chu et al. | ....................... | 714/746 |
| 2007/0028157 A1 * | 2/2007 | Drake et al. | ................... | 714/797 |
| 2009/0121764 A1 * | 5/2009 | Uemura et al. | ................ | 327/203 |

FOREIGN PATENT DOCUMENTS

| | | |
|---|---|---|
| JP | 2-33215 | 2/1990 |
| JP | 4-372214 | 12/1992 |
| JP | 6-237151 | 8/1994 |
| JP | 2007-124343 | 5/2007 |

OTHER PUBLICATIONS

PCT Written Opinion of the International Searching Authority mailed Nov. 13, 2007 for corresponding International Application No. PCT/JP2007/068258, with English-language Translation.
International Search Report mailed Nov. 13, 2007 for corresponding International Application No. PCT/JP2007/068258, with English-language Translation.

* cited by examiner

*Primary Examiner* — Douglas King
(74) *Attorney, Agent, or Firm* — Fujitsu Patent Center

(57) ABSTRACT

A disclosed memory circuit includes first and second latch circuits, each writing a write data at a timing of a clock signal and retaining the write data, the write data having been input in each of the first and second latch circuits, a data input circuit supplying the write data to each of the first and second latch circuits when a write enable signal indicates a state allowing the write data to be written, a write back circuit supplying the write data retained in the second latch circuit to the first latch circuit when the write enable signal indicates a state preventing the write data from being written, wherein a robustness against noise in the second latch circuit is more improved than that in the first latch circuit.

8 Claims, 5 Drawing Sheets

MEMORY CIRCUIT AND METHOD OF WRITING DATA TO AND READING DATA FROM MEMORY CIRCUIT

CROSS-REFERENCE TO RELATED APPLICATIONS

This application is a U.S. continuation application filed under 35 USC 111(a) claiming benefit under 35 USC 120 and 365(c) of PCT application JP2007/068258, filed Sep. 20, 2007. The foregoing application is hereby incorporated herein by reference.

FIELD

The embodiment discussed herein is related to a memory circuit and a method of writing data to and reading data from the memory circuit.

BACKGROUND

Japanese Laid-Open Patent Applications No. 6-237151 discloses a dual memory circuit to improve the reliability of the data retained in the memory circuit. The dual memory circuit includes a first latch circuit and a second latch circuit that are connected in parallel with each other. The first circuit is provided with an input terminal to operate the first latch circuit independently of the second latch circuit. This semiconductor integrated circuit device is capable of individually testing the latch circuits of the dual configuration, to ensure the merit if the dual configuration.

SUMMARY

According to an aspect of the present invention, there may be provided a memory circuit capable of preventing the increase of mounting surface area of the semiconductor integrated circuit device and the increase of the data delay as much as possible, and capable of effectively improving the robustness against soft error, noise, and the like.

According to an aspect of the present invention, there is provided a memory circuit including first and second latch circuits, each writing a write data at a timing of a clock signal and retaining the write data, the write data having been input in each of the first and second latch circuits; a data input circuit supplying the write data to each of the first and second latch circuits when a write enable signal indicates a state allowing the write data to be written; and a write back circuit supplying the write data retained in the second latch circuit to the first latch circuit when the write enable signal indicates a state preventing the write data from being written, wherein a robustness against noise in the second latch circuit is more improved than that in the first latch circuit.

The object and advantages of the disclosure will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is an exemplary circuit block diagram illustrating a memory circuit capable of improving the robustness against the data change due to soft error, noise and the like;

DESCRIPTION OF EMBODIMENT

In an information processing apparatus or the like, when a memory circuit is used as a memory which is required to have higher reliability and higher capability such as a memory that is a so-called register memory, the memory is required to have robustness against so-called soft error changing a logical state (data) retained in the memory due to $\alpha$-rays, neutron rays and the like.

Figure 1:
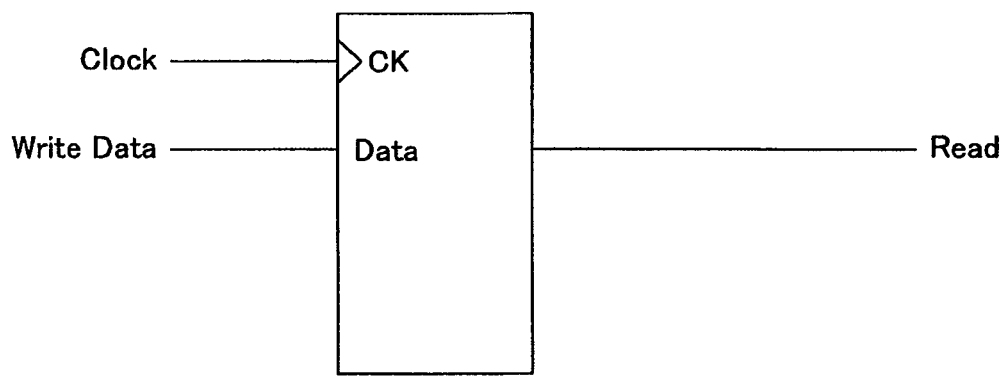
FIG. 1 is a drawing showing a latch circuit comprising a memory circuit.

In such a memory circuit, a latch circuit such as exemplarily illustrated in FIG. 1 may be used.

In the latch circuit as illustrated in FIG. 1, data input to the data terminal (Data) are written at every clock timings of the clock signal (Clock) input to the clock terminal (Ck). Further, the written data are retained until new data are written at the next clock timing, and read out as read out data (Read) from the output terminal of the latch circuit.

In such a latch circuit, however, it has been known that the data (logical state) retained therein may be (temporarily) changed due to the influence of $\alpha$-rays, neutron rays and the like. The change of the data (logical state) due to the influence of $\alpha$-rays, neutron rays and the like is called soft error.

In the following, embodiments of the present invention are described with reference to the accompanying drawings.

Figure 2:
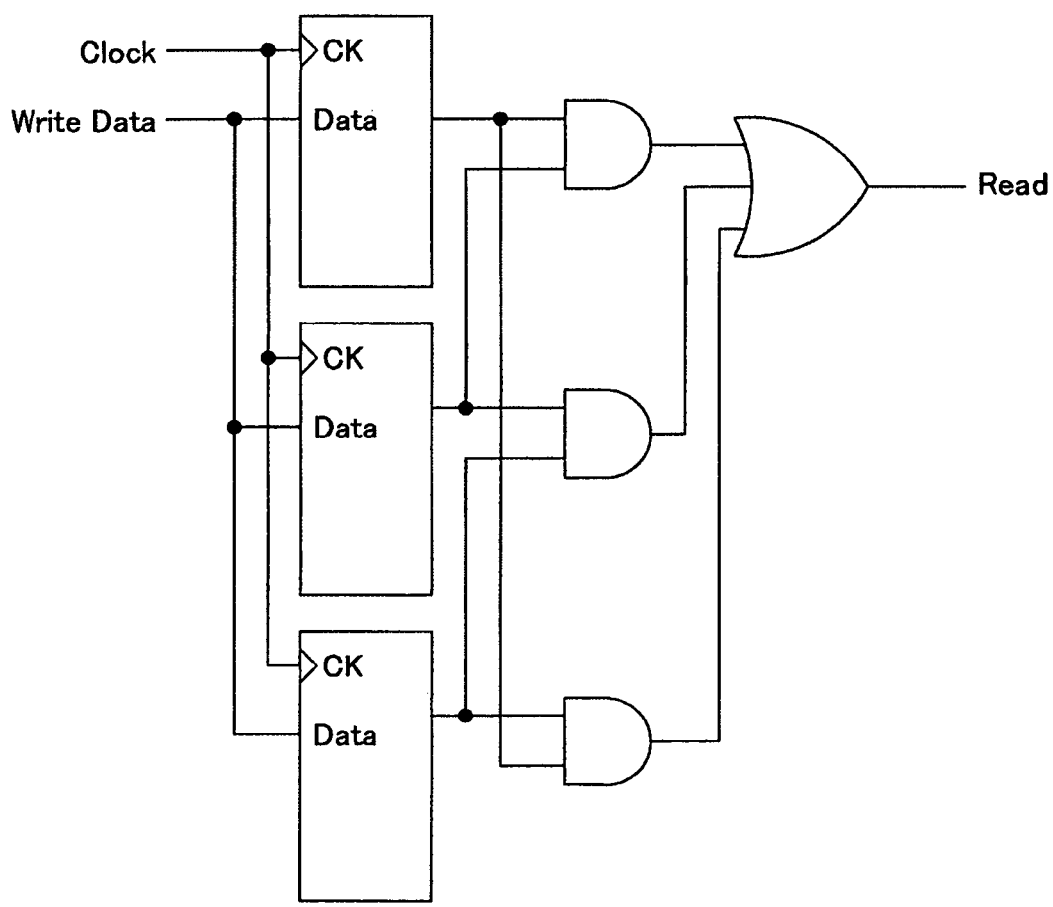

In order to prevent the degradation of the reliability of the data retained in the memory circuit due to the soft error, a circuit configuration as illustrated in FIG. 2 may be employed in the memory circuit.

As illustrated, in the memory circuit of FIG. 2, there are provided three latch circuits described above connected in parallel. Further, each of the output terminals of the three latch circuits is connected to respective two of three AND circuits, and the output terminals of the three AND circuits are connected to an OR circuit.

By having this configuration in the memory circuit having the three AND circuits and one OR circuit disposed downstream of the three latch circuits as illustrated in FIG. 2, a so called majority decision logic circuit is provided.

In this memory circuit of FIG. 2, if any of the data (logical state) retained in the three latch circuits connected in parallel are changed due to soft error or the like, whichever value (data or logical state) "1" or "0" holding a majority of the data retained in the latch circuits may be obtained (output) from the output terminal of the OR circuit as output of this majority decision logic circuit.

Because of this feature, if only one of the three data retained in the three latch circuits is changed due to soft error or the like, the data retained in the other two latch circuits may be obtained (output) as the output of the majority decision logic circuit. By doing this way, the robustness against the data change due to soft error or the like may be improved.

In addition, the robustness against soft error may be improved by including (connecting) a capacitive load (not shown in FIGS. 1 and 2) in the memory circuit as illustrated in FIG. 1.

In this way, by including (connecting) the capacitive load in the memory circuit, it may become possible to improve the reliability of data retained in the latch circuit and the robustness against the data change due to soft error or the like as well.

In the circuit configuration of the memory circuit as illustrated in FIG. 2, however, as many as three latch circuits are used in the circuit configuration of the memory circuit in FIG. 2, while there is one latch circuit for the memory circuit in as illustrated in FIG. 1. Because of this feature, when the circuit configuration of the memory circuit as illustrated in FIG. 2 is employed (integrated), a mounting surface area of the semiconductor may be accordingly increased. Further, when the data retained in the latch circuits are read out from the memory circuit latch circuits of FIG. 2, the data are required to pass through the AND circuits and OR circuit. Because of this feature, the output of the data may be delayed that much.

Further, in the circuit configuration in which the capacitive load is included (connected) in the latch circuit as described above, reliability of data retained in the latch circuit may be improved. However, it is perceived that a time period required to invert the data retained in the latch circuit may be increased, which may increase operation delay (data delay).

Figure 3:
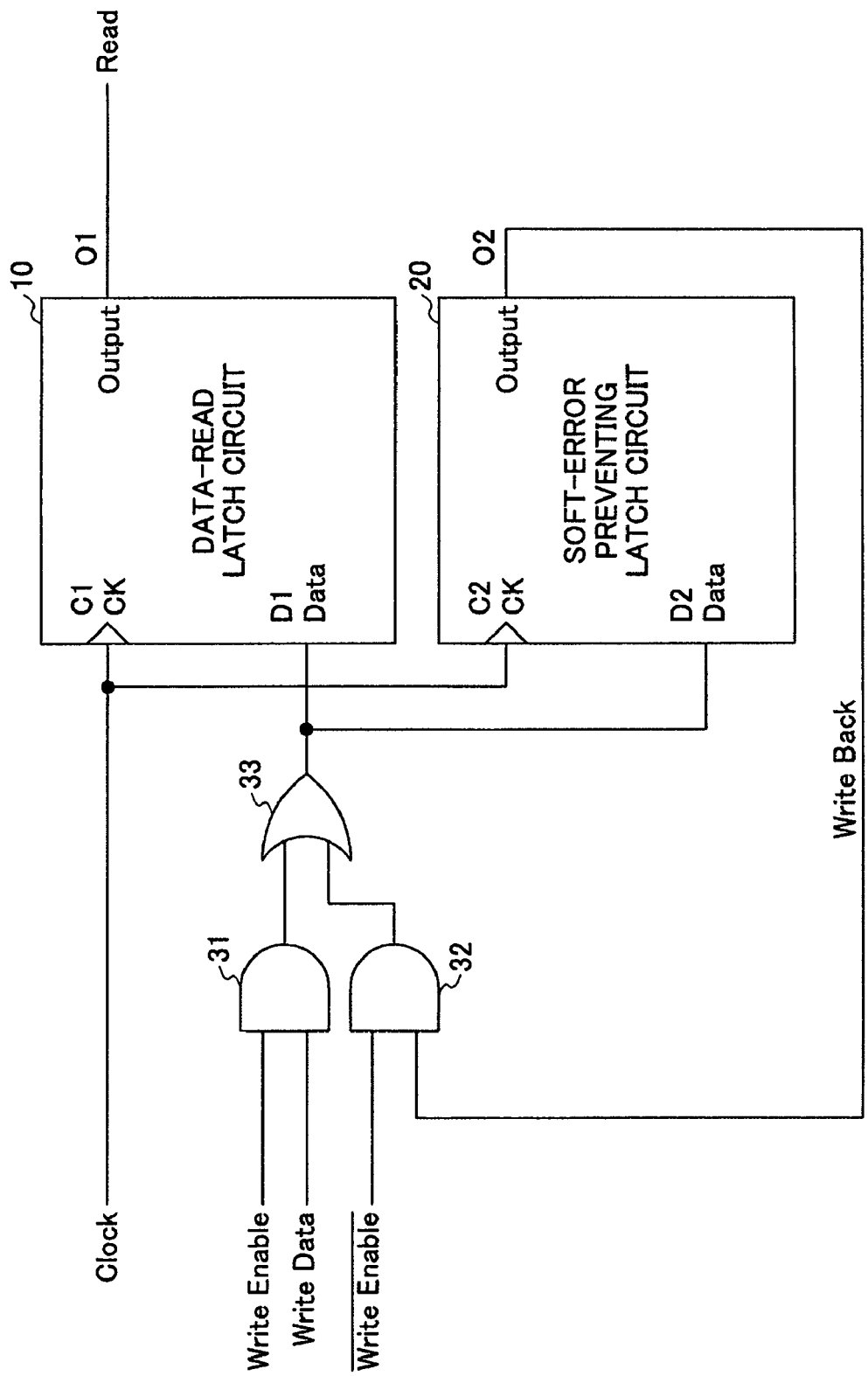
FIG. 3 is a circuit block diagram illustrating an exemplary memory circuit according to an embodiment of the present invention.

FIG. 3 illustrates a memory circuit according to an embodiment of the present invention. As illustrated in FIG. 3, the memory circuit includes a data-read latch circuit 10, a soft-error preventing latch circuit 20, AND circuits 31 and 32, and an OR circuit 33. The data-read latch circuit 10 retains the data to be read out from this memory circuit. Namely, when the data retained in the memory circuit are to be read out, the data retained in this data-read latch circuit 10 are read out as the output of this memory circuit. On the other hand, the soft-error preventing latch circuit 20 has a function capable of improving the robustness against soft error (i.e., the data change due to noise and the like). The AND circuit 31 and the OR circuit 33 are provided to input data (Write Data) to be written to each of the latch circuits 10 and 20. The AND circuit 32 and the OR circuit 33 are provided to input data (Write Back) that are retained in the soft-error preventing latch circuit 20 and that are to be input to each of the latch circuits 10 and 20.

In the circuit configuration of FIG. 3, a write enable signal (Write Enable) is input to one input terminal of the AND circuit 31; and data (Write Data) to be written to the memory circuit are input to the other input terminal of the AND circuit 31.

Further, an inverted write enable signal (Write Enable with overbar) is input to one input terminal of the AND circuit 32.

Further, the output terminals of the AND circuits 31 and 32 are connected to respective input terminals of the OR circuit 33.

Further, a clock signal (Clock) is input to the clock terminals C1 and C2 of the latch circuits 10 and 20, respectively. Further, the output terminal of the OR circuit 33 is connected to the data input terminals D1 and D2 of the latch circuits 10 and 20, respectively. Further, from the output terminal O1 of the data-read latch circuit 10, the data retained in the memory circuit is read out as the read out data (Read) to the outside of the memory circuit. Further, the output terminal O2 of the soft-error preventing latch circuit 20 is connected to the other input terminal of the AND circuit 32.

Figure 4:
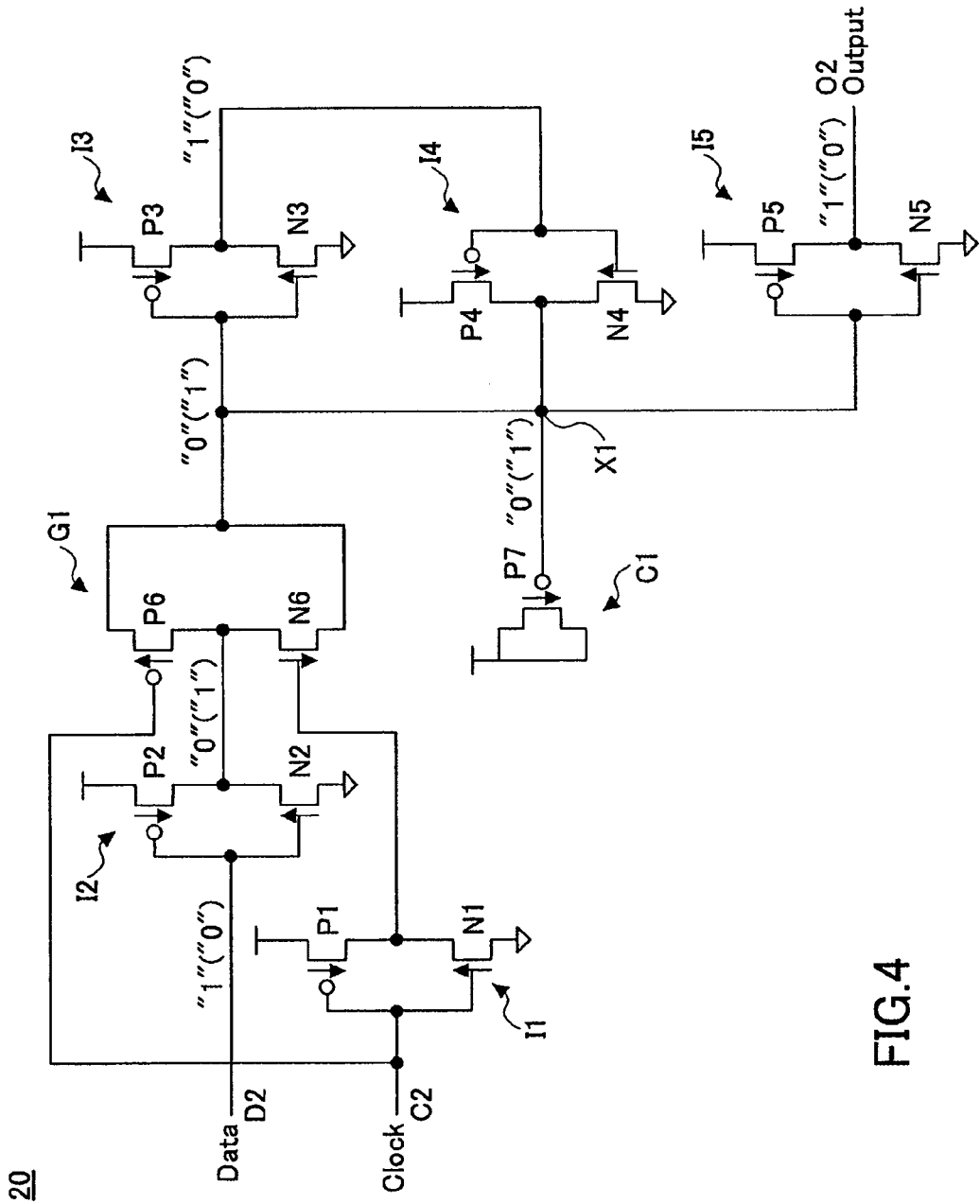
FIG. 4 is an exemplary circuit diagram illustrating a soft-error preventing latch circuit in FIG. 3.

FIG. 4 is a circuit diagram illustrating an exemplary internal circuit configuration of the soft-error preventing latch circuit 20 illustrated in FIG. 3.

In the soft-error preventing latch circuit 20 as illustrated in FIG. 4, the clock terminal C2 of the soft-error preventing latch circuit 20 is connected to the input terminal of an inverter circuit I1 having a PMOS transistor P1 and an NMOS transistor N1. Further, the data input terminal D2 of the soft-error preventing latch circuit 20 is connected to the input terminal of an inverter circuit I2 having a PMOS transistor P2 and an NMOS transistor N2.

The clock terminal C2 of the soft-error preventing latch circuit 20 is also connected to the inverting input terminal of a gate circuit G1 having a PMOS transistor P6 and an NMOS transistor N6. Further, the output terminal of the inverter circuit I1 is connected to the non-inverting input terminal of the gate circuit G1. Further, the output terminal of the inverter circuit I2 is connected to the data input terminal of the gate circuit G1.

Further, the output terminal of the gate circuit G1 is connected to an inverter circuit I3 having a PMOS transistor P3 and an NMOS transistor N3. Further, the output terminal of the inverter circuit I3 is connected to the input terminal of an inverter circuit I4 having a PMOS transistor P4 and an NMOS transistor N4. Further, the output terminal of the inverter circuit I4 is connected to the input terminal of an inverter circuit I5 having a PMOS transistor P5 and an NMOS transistor N5.

Further, a capacitive load C1 is connected to a connecting point X1 connected to the output terminal of the gate circuit G1, the input terminal of the inverter circuit I3, the output terminal of the inverter circuit I4, and the input terminal of the inverter circuit I5. As the capacitive load C1, a PMOS transistor with both source and drain grounded is used.

Further, the output terminal of the inverter circuit I5 is connected to the output terminal O2 of the soft-error preventing latch circuit 20.

In the following, operations of the soft-error preventing latch circuit 20 having such a circuit configuration as described above are described.

When the voltage level of the clock signal input to the clock terminal C2 is high (i.e., when data are not allowed to be written), the voltage level of the output of the inverter circuit I1 becomes low. Therefore, the high-level signal is applied to the inverting input terminal of the gate circuit G1, and the low-level signal is applied to the non-inverting input terminal of the gate circuit G1. As a result, the gate circuit G1 is closed. Therefore, in this case, the data input to the data input terminal D2 and inverted by the inverter circuit I2 are cut off by the gate circuit G1. Therefore, in this case, the data input to the data input terminal D2 are not written to (retained in) the soft-error preventing latch circuit 20.

On the other hand, when the voltage level of the clock signal input to the clock terminal C2 is low (i.e., when data are caused to be written), the voltage level of the output of the inverter circuit I1 becomes high. Therefore, the low-level signal is applied to the inverting input terminal of the gate circuit G1, and the high-level signal is applied to the non-inverting input terminal of the gate circuit G1. As a result, the gate circuit G1 is opened. Therefore, in this case, the data input to the data input terminal D2 and inverted by the inverter circuit I2 pass through the gate circuit G1 and are retained in the inverter circuit I3. By doing this way, the data input to the data input terminal D2 are written to (retained in) the soft-error preventing latch circuit 20.

More specifically, for example, when a logical value "1" is input to the data input terminal D2 of the soft-error preventing latch circuit 20, this logical value "1" is inverted to a logical value "0" by the inverter I2. Then, the inverted logical value "0" passes through the gate circuit G1 without being changed. Then, the logical value "0" is inverted to the logical value "1" by the inverter circuit I3, and retained in this inverter circuit I3.

The inverter circuit I4 is provided to feed back the data retained in the inverter circuit I3 to the input terminal of the inverter circuit I3. To that end, the inverter circuit I4 inverts the logical value of the data retained in the inverter circuit I3. Further, the logical value of the data inverted by the inverter circuit I4 is further inverted by the inverter circuit I5, and then output from the output terminal O2 of the soft-error preventing latch circuit 20.

In the example described above, when the logical value of the data retained in the inverter circuit I3 is "1", this logical value "1" is inverted to "0" by the inverter circuit I4 for feedback. Then, this logical value "0" is still further inverted to be retuned to "1" by the inverter circuit I5; and as a result, the logical value "1" is output from the output terminal O2 of the soft-error preventing latch circuit 20.

Similarly, when a logical value "0" is input to the data input terminal D2 of the soft-error preventing latch circuit 20, this logical value "0" is inverted to the logical value "1" by the inverter I2. Then, the inverted logical value "1" passes through the gate circuit G1 without being changed. Then, the logical value "1" is inverted to the logical value "0" by the inverter circuit I3, and retained in this inverter circuit I3. This logical value "0" of the data retained in the inverter circuit I3 is inverted to the logical value "1" by the inverter circuit I4 for feedback, and then is further inverted to be returned to the logical value "0", and output from the output terminal O2 of the soft-error preventing latch circuit 20.

It should be noted that the capacitive load C1 is included (connected) in the soft-error preventing latch circuit 20 to improve the robustness against soft error (i.e., data change due to noise and the like).

Due to this capacitive load C1, the logic value (voltage level) present at the connecting point X1 may not be easily changed because it is required to charge or discharge the capacitive load C1 to change the logical value (voltage level) present at the connecting point X1 connected to each of the output terminal of the gate circuit G1, the input terminal of the inverter circuit I3, and the output terminal of the inverter circuit I4. Because of this feature, the logical value (state) of the data retained in the soft-error preventing latch circuit 20 may not be easily changed; therefore, it may become possible to improve the robustness against soft error (i.e., data change due to noise and the like).

Further, in a memory circuit according to an embodiment of the present invention, the data-read latch circuit 10 has a similar circuit configuration to that of the soft-error preventing latch circuit 20 excepting the capacitive load C1. By having such a circuit configuration, the data-read latch circuit 10 may read data and write data by performing similar operations to those in the soft-error preventing latch circuit 20.

As described above, the data-read latch circuit 10 does not include the capacitive load C1 provided to improve the robustness against the data change due to soft error, noise and the like. By having this circuit configuration, in the data-read latch circuit 10, it is not required to charge or discharge the capacitive load C1 to change the logical value (signal level) of the data retained in the data-read latch circuit 10; and therefore, operation delay (data delay) due to the charging and discharging operations of the capacitive load C1 does not occur in the data-read latch circuit 10.

Further, it should be noted that the writing and reading operations of data in the data-read latch circuit 10 are performed independently from those in the soft-error preventing latch circuit 20, though the data-read latch circuit 10 and the soft-error preventing latch circuit 20 are connected in parallel with each other in the same memory circuit. Because of this feature, the writing and reading operations performed in the data-read latch circuit 10 may not be directly influenced by the capacitive load C1 included in the soft-error preventing latch circuit 20, and it may be difficult to conceive that operation delay (data delay) occurs in the data-read latch circuit 10 due to the capacitive load C1 included in the soft-error preventing latch circuit 20.

In the above example, a single PMOS transistor P7 is used as the capacitive load C1 included (connected) in the soft-error preventing latch circuit 20. The present invention, however, is not limited to this configuration. For example, a complementary MOS transistor similar to the inverter circuits I1 through I5 included in the soft-error preventing latch circuit 20 may be alternatively used as the capacitive load C1.

Figure 5:
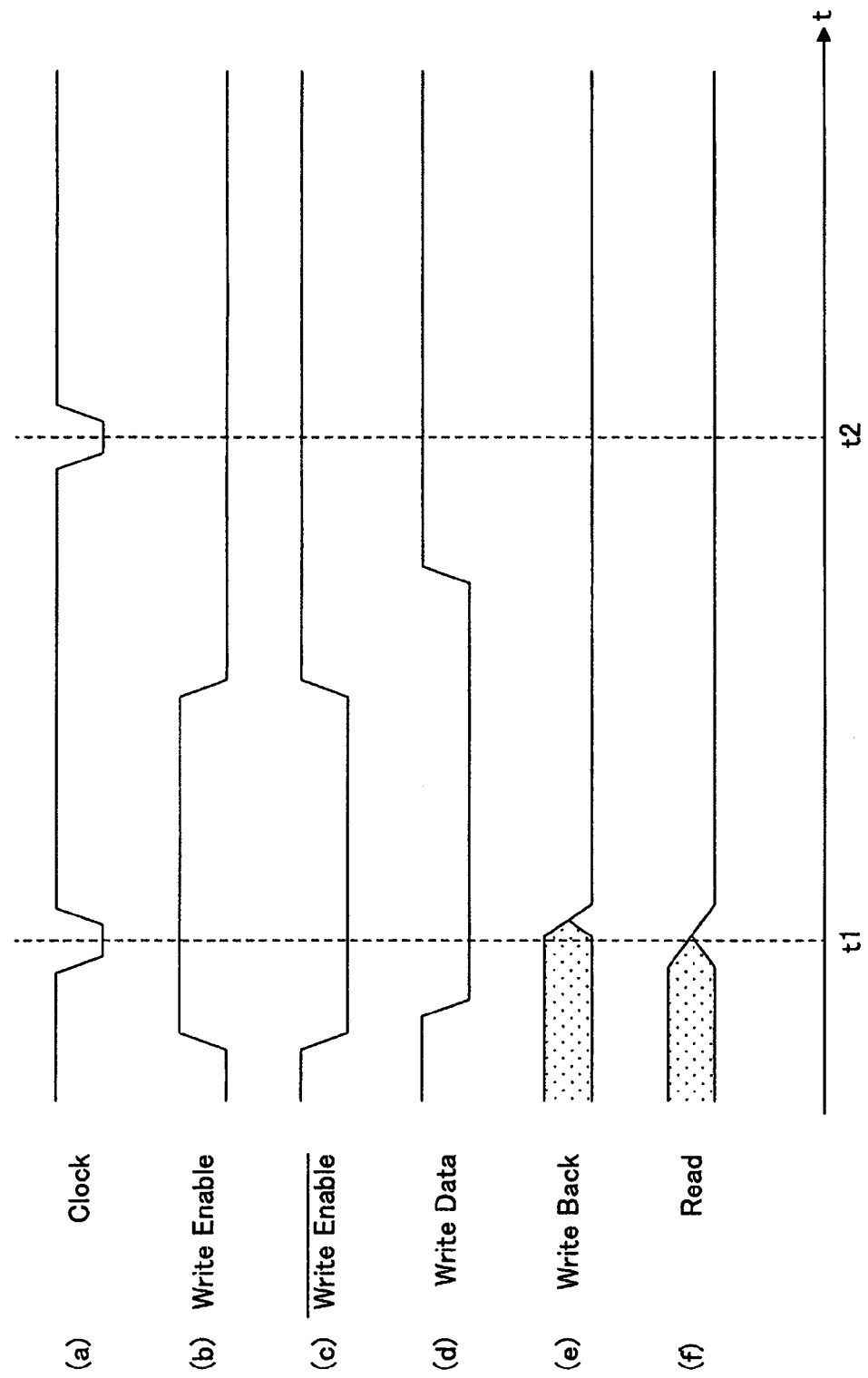
FIG. 5 is a timing chart illustrating exemplary operations of the memory circuit according to an embodiment of the present invention in FIG. 3.

Next, with reference to a time chart of FIG. 5, the operations of the memory circuit according to an embodiment of the present invention as illustrated in FIG. 3 are described.

As illustrated in FIG. 5, at a timing just before the time t1, the voltage level of the write enable signal (Write Enable) in column (b) of FIG. 5 is high, and the voltage level of the inverted write enable signal (Write Enable with overbar) in column (c) of FIG. 5 is low, which indicates that write data are allowed to be written. Further, at this timing, the voltage level of the data being input to be written to the memory circuit (Write Date) (hereinafter referred to as "write data") in column (d) of FIG. 5 is low, indicating that the logical value (data) "0" is being input as the write data.

As a result of the conditions described above, a high level is applied as the input of the write enable signal (Write Enable) to one of the input terminals of the AND circuit 31, which then passes the write data applied to the other input terminal of the AND circuit 31 through the AND circuit 31 to the output terminal of the AND circuit 31. In the case of FIG. 5, the logical value (voltage level) of the write data (Write Data) is "0"; therefore, the logical value "0" (low level) is output from the AND circuit 31.

On the other hand, a low level is applied as the input of the inverted write enable signal (Write Enable with overbar) to one of the input terminals of the AND circuit 32, which then cuts off the signal input to the other input terminal of the AND circuit 32. Namely, the output of the soft-error preventing latch circuit 20 is cut off by the AND circuit 32. In this case, the logical value "0" (low level) is output from the AND circuit 32.

As a result, regardless of the output of the soft-error preventing latch circuit 20, the logical value "0" (low level) is applied as the output of the AND circuit 32 to one input terminal of the OR circuit 33, which then passes the output of the AND circuit 31 applied to the other input terminal of the OR circuit 33 (i.e., the write data (Write Data)) through the OR circuit 33 to be output from the OR circuit 33. Namely, at the timing just before the time t1 in FIG. 5, the write data is "0"; therefore the output of the OR circuit 33 is low level indicating the logical value "0".

This low level indicating the logical value "0" is applied to the data input terminals D1 and D2 of the latch circuits 10 and 20, respectively. Namely, the logical value (data) "0" is input to each of the latch circuits 10 and 20.

Then, at the time t1, the level of the clock signal (Clock) in column (a) of FIG. 5 is low, which then allows data (in this case, the write data) to be written to each of the latch circuits 10 and 20. To respond to this low level of the clock signal (Clock), the latch circuits 10 and 20 have inputs (take in) the low level indicating the logical value "0" applied to the data input terminals D1 and D2, respectively. Namely, the write data indicating the logical value "0" are written and retained in each of the latch circuits 10 and 20.

As a result of the retained write data "0" in the latch circuits 10 and 20, the output of the data-read latch circuit 10 (i.e., the logical value (data) present at the output terminal O1 of the data-read latch circuit 10) becomes "0" (low level) similar to that of the write data as is illustrated as read data (Read) in column (f) of FIG. 5.

Similarly, the output of the soft-error preventing latch circuit 20 (i.e., the logical value (data) present at the output terminal O2 of the soft-error preventing latch circuit 20) becomes "0" (low level) similar to that of the write data that are illustrated as data for write back (Write Back) in column (e) of FIG. 5.

As described in detail below, the data for write back (Write Back) are data to be used to overwrite the write data in the latch circuits 10 and 20 when the write enable signal (Write Enable) in column (b) of FIG. 5 and the inverted write enable signal (Write Enable with overbar) in column (c) of FIG. 5 are in a state preventing the write data from being written in the latch circuits 10 and 20.

As described above, the soft-error preventing latch circuit 20 includes a configuration (component, device) capable of improving the robustness against soft error (i.e., the data change due to soft error, noise or the like) by including connecting the capacitive load C1 as illustrated in FIG. 4. By having this configuration (i.e., the capacitive load C1), even in a case where the data retained in the data-read latch circuit 10 are changed due to noise or the like, the configuration of the soft-error preventing latch circuit 20 including the configuration as described above (i.e., capacitive load C1) may effectively prevent the data retained in the soft-error preventing latch circuit 20 from being changed due to soft error, noise or the like.

By having such configuration, in a case where the data retained in the data-read latch circuit 10 are changed but the data retained in the soft-error preventing latch circuit 20 are not changed, the data retained in the soft-error preventing latch circuit 20 may be used as data for write back to overwrite the data retained in the data-read latch circuit 10, so that the data retained in the data-read latch circuit 10 may be modified (corrected).

Referring back to the description of the operations illustrated in FIG. 5, operations at the timing just before the time t2 are described. At the timing just before the time t2, the voltage level of the write enable signal (Write Enable) in column (b) of FIG. 5 is low and the voltage level of the inverted write enable signal (Write Enable with overbar) in column (c) of FIG. 5 is high, which indicates the state preventing the write data from being written in the latch circuits 10 and 20. In the conditions, a low level is applied as the input of the write enable signal (Write Enable) to one of the input terminals of the AND circuit 31, which then cuts off the signal input to the other input terminal of the AND circuit 31 (i.e., write data (Write Data)). As a result, the logical level of the output of the AND circuit 31 becomes low.

As a result, the low level as the output of the AND circuit 31 is applied to one input terminal of the OR circuit 33, which then allows the signal applied to the other input terminal of the OR circuit 33 to pass through the OR circuit 33 without being changed.

On the other hand, the high level is applied as the input of the inverted write enable signal (Write Enable with overbar) to one of the input terminals of the AND circuit 32, which then allows the output signal applied to the other input terminal of the AND circuit 32 (i.e., the data for write back) to pass through the AND circuit 32 without being changed. At the timing just before the time t2, the logical value of the data for write back is "0"; therefore, the output of the AND circuit 32 becomes the low level and this low-level signal is applied to the other input terminal of the OR circuit 33 to be output from the OR circuit 33.

In this case, the signal level of the data for write back applied to the other input terminal of the OR circuit 33 is low indicating logical value "0"; therefore, this low-level signal passes through the OR circuit 33 and is output from the OR circuit 33 without being changed. As a result, the logical value (data) "0" of the data for write back overwrite (i.e., write back) the data in the latch circuits 10 and 20.

As described above, in a memory circuit according to an embodiment of the present invention, after the write data are written to each of the latch circuits 10 and 20 at the time t1, if the write enable signal (Write Enable) and the inverted write enable signal (Write Enable with overbar) indicate a state preventing the write data from being written to the latch circuits 10 and 20 at the next clock timing of the time t2, the data retained in the soft-error preventing latch circuit 20 may be used as overwriting data for write back in the data-read latch circuit 10.

Therefore, in a case where, after the write data are written to each of the latch circuits 10 and 20 at the time t1, if the data retained in the data-read latch circuit 10 is changed due to soft error, noise or the like during the time period between the time t1 and the time t2, the data retained in the soft-error preventing latch circuit 20 may be used as overwriting data for write back in the data-read latch circuit 10. By writing back in this way, when the data retained in the data-read latch circuit 10 have a wrong value due to the change of the retained data, the wrong value of the data retained in the data-read latch circuit 10 may be automatically modified (corrected) so that the data retained in the data-read latch circuit 10 may have the correct value.

In the case of FIG. 5, after the write data indicating the logical value "0" are written to each of the latch circuits 10 and 20 at the time t1, if the data retained in the data-read latch circuit 10 are changed due to soft error, noise or the like during the time period between the time t1 and the time t2, the data indicating the logical value "0" and retained in the soft-error preventing latch circuit 20 may be used as overwriting data for write back in the data-read latch circuit 10. By writing back in this way, when the data retained in the data-read latch circuit 10 have the wrong value (i.e., the logical value "1" in this case) due to the change of the retained data, the wrong value of the data retained in the data-read latch circuit 10 may be automatically modified (corrected) so that the data retained in the data-read latch circuit 10 may have the correct value "0".

In FIG. 5, a case is illustrated where the logical value (data) of the write data is "0". However, similar operations may be performed when the logical value (data) of the write data is "1". Namely, in this case, at the time t1, the logical value (data) of write data "1" is written to each of the latch circuits 10 and 20. Next, at the time t2, the data retained in the soft-error preventing latch circuit 20 may be used as overwriting data for write back in each of the latch circuits 10 and 20.

By having this feature, in this case as well as the case described above, after the logical value (data) of write data "1" is written to each of the latch circuits 10 and 20 at the time t1, if the data retained in the data-read latch circuit 10 are changed due to soft error, noise or the like during the time period between the time t1 and the time t2, the data indicating the logical value "1" and retained in the soft-error preventing latch circuit 20 may be used as overwriting data for write back in the data-read latch circuit 10. By writing back in this way, when the data retained in the data-read latch circuit 10 have the wrong value (i.e., the logical value "0" in this case) due to the change of the retained data, the wrong value of the data retained in the data-read latch circuit 10 may be automatically modified (corrected) so that the data retained in the data-read latch circuit 10 may have the correct value "1".

As described above, in a memory circuit according to an embodiment of the present invention, as illustrated in FIG. 3, the data-read latch circuit 10 and the soft-error preventing latch circuit 20 are separately provided. This separated circuit configuration may have advantage over the configuration as illustrated in FIG. 2 where a majority decision logic circuit is provided. This is because, in the configuration having the majority decision logic circuit illustrated in FIG. 2, when the retained data are read out, the data are required to pass through the AND circuit and OR circuit. Because of this feature, the operation delay (data delay) may occur. On the other hand, in the memory circuit according to an embodiment of the present invention as illustrated in FIG. 3, it may become possible to directly read out the data retained in the data-read latch circuit 10 without passing the data through any AND circuit, OR circuit or the like. By having this feature, the operation delay (data delay) may occur in the data-read latch circuit 10.

Further, the circuit configuration having the majority decision logic circuit illustrated in FIG. 2 requires three (3) latch circuits. On the other hand, the memory circuit according to an embodiment of the present invention as illustrated in FIG. 3 requires two (2) latch circuits only, which are the data-read latch circuit 10 and the soft-error preventing latch circuit 20. Because of this feature, when the memory circuit according to an embodiment of the present invention as illustrated in FIG. 3 is used (integrated) in a semiconductor integrated circuit device, a mounting surface area of the semiconductor integrated circuit device may be reduced and power consumption may also be reduced when compared with the case where the majority decision logic circuit is used.

The memory circuit according to an embodiment of the present invention may be applicable to a part (component) where a soft error rate (SER) is expected to be high in an information processing system using a computer and the like.

By using the memory circuit according to an embodiment of the present invention in the information processing system and the like, it may become possible to reduce the number of latch circuits, AND circuits, OR circuits and the like; therefore, it may become possible to reduce the number of gate circuits, the mounting surface area, and power consumption, and further, it may become possible to effectively improve the reliability of the data retained in the memory circuit.

Figure 6:
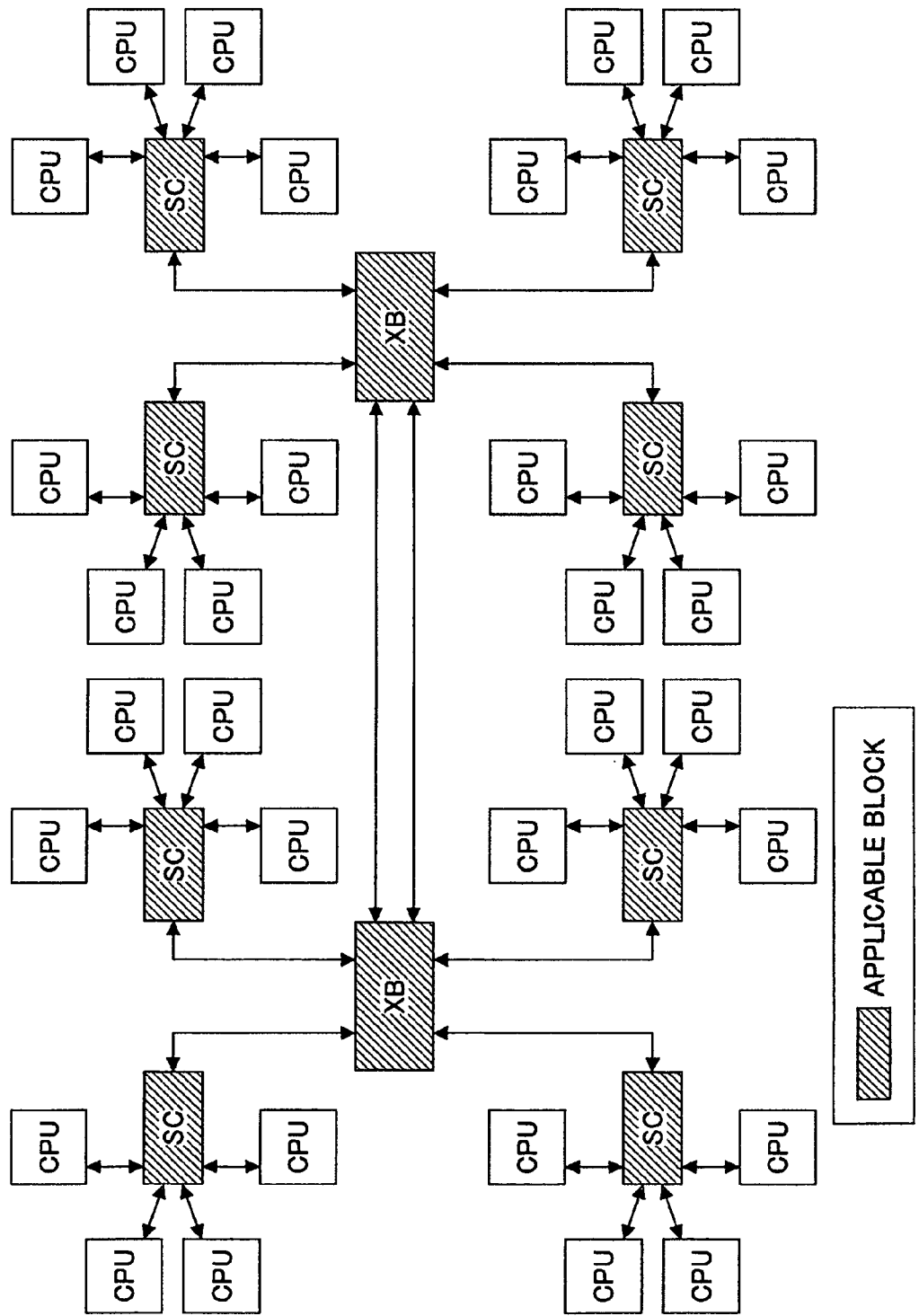
FIG. 6 is a block diagram illustrating an example of a configuration of an information processing system capable of employing a memory circuit according to an embodiment of the present invention.

FIG. 6 is a block diagram illustrating an example of a configuration of an information processing system capable of employing the memory circuit according to an embodiment of the present invention.

In the system illustrated in FIG. 6, plural CPUs are connected to each other via a system control unit(s) SC, a crossbar switch unit(s) XB and the like in a network manner, so as to cooperate together to perform predetermined information processing operations.

In an information processing system having such a configuration, by applying the memory circuit according to an embodiment of the present invention as described above to the control unit(s) SC, the crossbar switch unit(s) XB and the like, it may become possible to reduce the number of latch circuits, AND circuits, OR circuits and the like; therefore, it may become possible to reduce the number of gate circuits, the mounting surface area, and power consumption, and further, it may become possible to effectively improve the reliability of the data retained in the memory circuit.

Further, the data-read latch circuit 10 corresponds to a first latch circuit; the soft-error preventing latch circuit 20 corresponds to a second latch circuit; a combination of the AND circuit 31 and the OR circuit 33 corresponds to a data input circuit; and a combination of the AND circuit 32 and the OR circuit 33 corresponds to a write back circuit.

According to an embodiment of the present invention, there is provided a memory circuit including first and second latch circuits, each writing a write data at a timing of a clock signal and retaining the write data, the write data having been input in each of the first and second latch circuits; a data input circuit supplying the write data to each of the first and second latch circuits when a write enable signal indicates a state allowing the write data to be written; and a write back circuit supplying the write data retained in the second latch circuit to the first latch circuit when the write enable signal indicates a state preventing the write data from being written, wherein a robustness against noise in the second latch circuit is more improved than that in the first latch circuit.

By having this configuration, the write data are written to each of the first and second latch circuits. Then, the write data retained in the second latch circuit overwrite the write data in the first latch circuit.

In this configuration, the robustness against noise in the second latch circuit is more improved than that in the first latch circuit. By having this configuration, even in a condition where the data retained in the first latch circuit are changed due to the influence of noise or the like, the data retained in the second latch circuit may not be easily changed.

Therefore, there may be higher likelihood that the data retained in the second latch circuit are not changed even though the data retained in the first latch circuit are changed. In this case, by overwriting the data retained in the second latch circuit on the data retained in the first latch circuit, it may become possible to modify (correct) the data retained in the first latch circuit.

Further, when a capacitive load or the like is included in the second latch circuit to improve the robustness against noise, operation delay (data delay) may occur if the write data are read out directly from the second latch circuit. However, in the memory circuit according to an embodiment of the present invention, the write data are read out from the first latch circuit having no such capacitive load which may cause the operation delay (data delay). By having this feature, it may become possible that at least the fundamental operations such as writing data to and reading data from the memory circuit may not be influenced (delayed) by the operation delay (data delay) caused due to the capacitive load.

Therefore, it may become possible to improve the robustness against soft error (i.e., the data change due to noise) without increasing the operation delay (data delay).

Further, the number of latch circuits may be limited to two (2) units in the memory circuit. Because of this feature, it may become possible to better control the increase of the mounting surface area of the semiconductor integrated circuit device as much as possible.

In a memory circuit according to an embodiment of the present invention, it may become possible to improve the robustness against the soft error (i.e., data change due to noise or the like) in the memory circuit while better controlling the increase of the mounting surface area of the semiconductor integrated circuit device without increasing the operation delay (data delay).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that various changes, substitutions, and alterations could be made hereto without departing from the sprit and scope of the invention.

What is claimed is:

1. A memory circuit comprising:
   first and second latch circuits, each configured to have written a data at a timing of a clock signal and retained the data, a robustness against noise in the second latch circuit being more improved than that in the first latch circuit;
   a data input circuit configured to supply a write data which is input to the memory circuit to each of the first and second latch circuits connected in parallel to the data input circuit when a write enable signal indicates a state allowing the write data to be written; and
   a write back circuit configured to supply the data retained in the second latch circuit to the first latch circuit when the write enable signal indicates a state preventing the write data from the data input circuit from being written to the first latch circuit.

2. The memory circuit according to claim 1, wherein
   The data retained in the first latch circuit are output as a read out data of the memory circuit.

3. The memory circuit according to claim 1, wherein
   the improvement of the robustness against noise in the second latch circuit is achieved by a capacitive load included in the second latch circuit.

4. The memory circuit according to claim 3, wherein
   a single or complementary pair of transistors are used as the capacitive load.

5. The memory circuit according to claim 3, wherein the second latch circuit comprising:
   a gate circuit configured to pass the write data input at a timing of the clock signal;
   a retaining circuit having an input terminal connected to an output terminal of the gate circuit and configured to retain an output signal of the gate circuit; and
   a feed back circuit having an input terminal connected to an output terminal of the retaining circuit and configured to feed back the data retained in the retaining circuit to the output terminal of the gate circuit, wherein
   the capacitive load is connected to a connecting point connected to each of the output terminal of the gate circuit, the input terminal of the retaining circuit, and an output terminal of the feed back circuit.

6. A method of writing data to and reading data from a memory circuit, the memory circuit including first and second latch circuits, the method comprising:
   writing a write data which is input to the memory circuit to each of the first and second latch circuits connected in parallel at a same timing of a clock signal when a write enable signal indicates a state allowing the write data to be written; and
   writing a data retained in the second latch circuit, which has a robustness against noise more improved than that of the first latch circuit, to the first latch circuit at a timing of a clock signal when the write enable signal indicates a state preventing the write data input to the memory circuit from being written to the first latch circuit.

7. The method of writing data to and reading data from a memory circuit according to claim 6, further comprising:
   reading out and outputting the data retained in the first latch circuit to outside of the memory circuit.

8. A memory circuit comprising:
   a first latch circuit having a first input terminal to input data and a first output terminal to output the data and configured to retain the data input from the first input terminal;
   a second latch circuit connected in parallel with the first latch circuit and having a second input terminal to input data, a second output terminal to output the data, and a capacitive load, and configured to retain the data input from the second input terminal; and
   a selector circuit configured to output a write data which is input to the memory circuit to each of the first input terminal and the second input terminal connected in parallel to the selector circuit when a write enable signal indicates a state allowing the write data to be written, and output a data retained in the second latch circuit to each of the first input terminal and the second input terminal, the data being output from the second output terminal, when the write enable signal indicates a state preventing the write data input to the memory circuit from being written to the first latch circuit.

\* \* \* \* \*